United States Patent [19]
Lees et al.

[11] Patent Number: 6,061,903
[45] Date of Patent: May 16, 2000

[54] ASSEMBLY OF ELECTRICAL COMPONENTS ON PRINTED CIRCUIT BOARDS

[75] Inventors: Stuart Lees; Noel Patrick Glancy, both of Renfrewshire, United Kingdom

[73] Assignee: International Business Machines Corporation, Armonk, N.Y.

[21] Appl. No.: 09/071,547

[22] Filed: May 1, 1998

[30] Foreign Application Priority Data

Oct. 10, 1997 [GB] United Kingdom .................... 9721440

[51] Int. Cl.⁷ ........................................................ H05K 3/30
[52] U.S. Cl. .................................. 29/837; 29/830; 29/740
[58] Field of Search .............................. 29/741, 757, 836, 29/845, 566.1, 566.3, 340, 837; 361/407.1, 408, 566

[56] References Cited

U.S. PATENT DOCUMENTS

| | | | |
|---|---|---|---|
| 2,977,530 | 3/1961 | Cook | 324/51 |
| 3,932,931 | 1/1976 | Wright | 29/626 |
| 4,463,310 | 7/1984 | Whitley | 324/73 |
| 4,627,157 | 12/1986 | Campisi et al. | 29/741 |
| 5,235,740 | 8/1993 | Kroeker et al. | 29/741 |

*Primary Examiner*—Lee Young
*Assistant Examiner*—Sean Smith
*Attorney, Agent, or Firm*—Lawrence R. Fraley

[57] ABSTRACT

Inspection apparatus is disclosed for providing a visual indication of the proper merger of the conductive pins of an electrical component in the corresponding openings in a printed circuit board. The apparatus includes an inspection plate which has a plurality of channels defined between first and second opposite faces. In the channels are mounted a plurality of inspection pins which move between a first, rest position (countersunk with respect to the top surface of the inspection plate) and a second, extended position (flush with the plate's top surface). The inspection pins in the plate correspond in number and configuration to the component conductive pins but have a greater cross sectional area than that of the conductive pins. When the component is merged with the printed circuit board, each connector pin passes through the corresponding circuit board opening and pushes against the corresponding inspection pin to cause it to move to the extended position. If the conductive pin is bent or deformed, the inspection pin remains in the rest position such that the apparatus operator is provided with a visual indication of which conductive pins have not merged correctly with the circuit board.

3 Claims, 3 Drawing Sheets

ASSEMBLY OF ELECTRICAL COMPONENTS ON PRINTED CIRCUIT BOARDS

FIELD OF THE INVENTION

The present invention relates generally to the assembly of electrical components on a printed circuit board and more specifically to a method and apparatus for detecting the proper placement of component connector pins within corresponding vias in the circuit board.

BACKGROUND OF THE INVENTION

The population of printed circuit boards (PCBs), for example system motherboards or adapter cards, invariably involves the attachment of one or more multi-pin card connectors into corresponding vias (openings) defined in the PCB. Such connectors typically include tens or hundreds of pins each having a diameter which is typically a fraction of a millimeter. In merging such a connector to a PCB, one or more pins can easily become bent or deformed in which case the defective pin may not be correctly placed within the corresponding via. A defective pin, if not detected when the PCB and connector are merged, can lead to the scrapping or reworking of the entire PCB.

It is thus important to verify the proper placement of pins within their respective vias and to this end a number of different techniques have been proposed. The simplest, in terms of cost and complexity, is a visual inspection technique in which the merged PCB/connector is examined to verify that all pins are protruding through the PCB. A bent or deformed pin is thus detected visually by the absence of a pin protruding from the side of the PCB opposite the connector. Although simple in concept, this technique is time consuming and prone to error on the part of the person performing the check.

An alternative technique for verifying the proper placement of components is described in U.S. Pat. No. 5,235,740 (Kroeker et al). In this patent, a test block is provided which serves to support the PCB receiving the electrical component. Provided in the test block are a plurality of electrical probes configured in the same pattern as the vias in the circuit board. If, on merging the circuit board and the connector, a pin becomes bent or deformed and does not pass through its corresponding via to contact the probe, a circuit is made and an indication is provided to the operator. Although this system is more fool-proof than simple visual inspection of absent pins, it suffers from the disadvantages of increased complexity and cost, which are exacerbated when multiple systems are required on a manufacturing line. What is needed is a simple, reliable technique for verifying the proper placement of electrical components on printed circuit boards.

OBJECTS AND SUMMARY OF THE INVENTION

It is, therefore, a primary object of the present invention to provide a new and unique means for successfully connecting an electrical component onto a printed circuit board or the like.

It is another object of the invention to provide an apparatus and method for accomplishing such connecting wherein the component includes several conductive pins and the receiving board includes a plurality of receiving vias (holes).

According to the present invention therefore, there is provided an apparatus for connecting a component having a plurality of conductive pins to a circuit board having a plurality of corresponding vias, the pins when correctly positioned in the vias extending through the circuit board. The apparatus comprises indicating means for providing a visual indication of the proper placement of one or more conductive pins within the corresponding vias in the circuit board, the indicating means in turn comprising an inspection plate including a plurality of channels defined between first and second opposite faces thereof and further including a plurality of inspection pins mounted for reciprocal movement within the channels between a rest position and an extended position. The inspection pins in the plate correspond in number and configuration to the component conductive pins, but include a cross sectional area greater than that of the conductive pins. The invention further includes locating means for locating the circuit board and component with respect to the plate such that the plate is positioned adjacent the side of the circuit board opposite the component and the inspection pins in the plate are aligned with the corresponding conductive pins and vias. The invention also comprises merging means for merging the circuit board and component such that when the component and board are merged, those conductive pins which extend through the circuit board engage the corresponding inspection pins in the plate to cause the inspection pins to move from the rest to the extended position to thereby provide a visual indication of the proper placement of each individual connector pin in its corresponding via.

Thus the apparatus according to the present invention makes use of an inspection plate employing inspection pins which have a greater cross-sectional area than the component's conductive pins. After merger of the circuit board and component, the operator of the apparatus can more easily detect a bent or deformed conductive pin by scanning the inspection plate for inspection pins which are not in the extended position. This apparatus thus provides for reliable detection in a simple, yet effective manner.

In order to provide easier visual detection, it is preferred that when in the rest position, a first end face of the inspection pin is countersunk with respect to the first face of the plate and when in the extended position, the first end face is substantially flush with the first face of the plate. The locating means acts to locate the second face of the plate adjacent the side of the circuit board opposite the component. Thus, properly placed conductive pins are indicated by the face of the inspection pin being flush with the face of the plate, with a bent or deformed conductive pin being readily observed by the presence of a countersunk inspection pin in the corresponding position in the inspection plate.

In order to further enhance the visibility of the location of defective conductive pins, the plate preferably includes a contrast layer disposed between the first and second faces such that when the inspection pin is in the countersunk position, the contrast layer in the corresponding channel is visible to the operator. A number of suitable plate and contrast layer materials could be used to provide the necessary visual contrast between the rest and extended positions. For example, the plate faces may comprise two outer metallic layers, in between which is provided a contrast layer of black material, e.g., plastic.

It is believed that such an apparatus and method will constitute significant advancements in the art.

DETAILED DESCRIPTION OF THE PREFERRED EMBODIMENT

Figure 1:
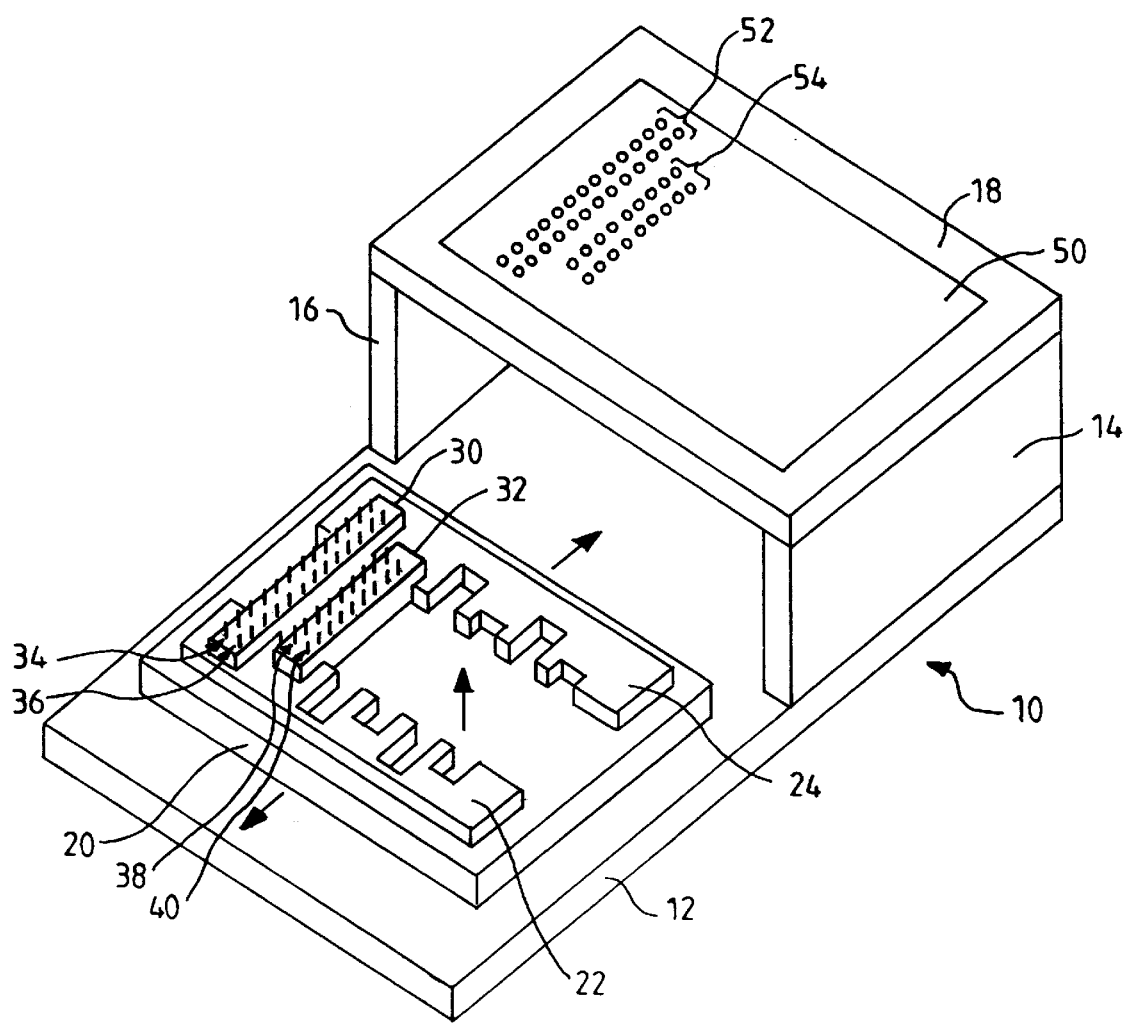
FIG. 1 is an isometric schematic view of the connecting apparatus according to the preferred embodiment of the present invention.

With reference first to FIG. 1, there is shown an isometric view of a connecting apparatus 10 of a preferred embodiment of the present invention. The apparatus includes a unit base plate 12, extending from the sides of which are two side plates 14, 16. A top plate 18 is located on top of the side plates. Positioned on the base plate for reciprocal movement on linear bearings (not shown) in a direction in and out of the cavity defined between the top, base and side plates is a connector nest plate 20 on which are removably mounted front and rear nest fixtures 22, 24. The nest fixtures define six locations for receiving connectors, two of the connectors 30, 32 being shown in the locations in FIG. 1.

Extending from each connector are two rows of connector pins 34, 36 and 38, 40 which face upwards away from the nest plate. In a typical connector there will be upwards of a hundred pins (only a few are shown in FIG. 1 for the sake of simplicity) which extend 1.5 mm above the surface of the connector body. The pins may have a cross-sectional area of the order of about 0.36 sq mm and may be positioned at a pitch of about 2.54 mm. It will be understood that the applicability of the present invention is not limited to pins having these dimensions. However from the following description it will be appreciated that the invention makes use of the fact that the pitch is relatively large compared to the pin diameter.

With further reference to FIG. 1, there is shown an inspection pin cassette 50, removably located in the top plate, which provides six groups of inspection pins corresponding to the six connectors (for the sake of simplicity only two groups of inspection pins 52, 54 are shown). As defined herein, the inspection pins are used to provide a visual indication of the correct merger of the connector's pins with the PCB. The number and location of the inspection pins in each group replicates the number and position of the connector pins in the corresponding connector. However the inspection pins have a larger cross sectional area than that of the connector pins. The inspection pin dimension used is conditioned by the pitch of the connector pins which in the present embodiment allows for a inspection pin cross section which is 25 times that of the connector pin.

Figure 2:
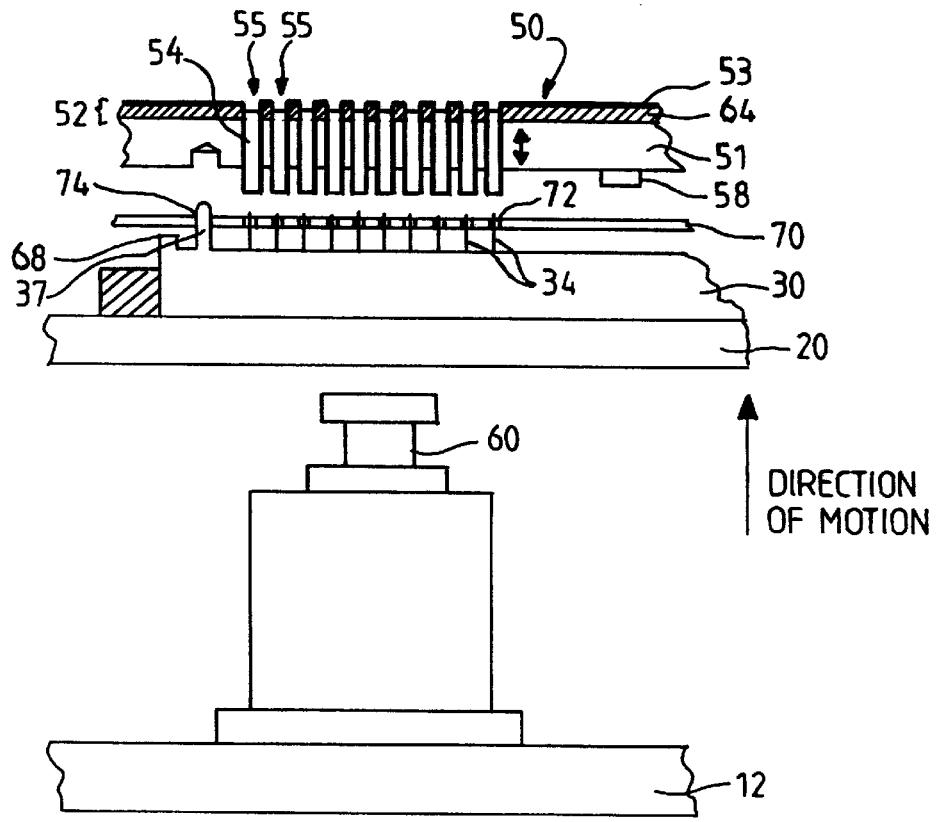
FIG. 2 is a cross-sectional schematic view of part of the apparatus of FIG. 1, in which the PCB and connectors are shown in a partially merged position.

With reference now to FIG. 2, there is shown a cross-sectional view of a portion of the apparatus with the nest plate 20 shown located within the cavity and in the position adopted prior to the final merging of the connectors and PCB. Mounted on the base plate 12 is an air cylinder 60 which, when actuated, causes the connectors to fully merge with the PCB and push against the inspection pins in the cassette.

The inspection pin cassette includes a cassette plate 51 on which is formed a laminar structure 52 comprising a top inspection plate 53, formed for example from brushed aluminum, and a contrast layer 64 formed for example from an opaque material such as black plastic. Defined in the cassette and extending through both the cassette plate 51 and the laminar structure 52 are a plurality of channels 55 in each of which is mounted an inspection pin 54. The inspection pins move within the channels between a first rest position shown in FIG. 2 and an extended, second position where the tops of the engaged inspection pins are flush with the upper surface of the top inspection plate 53 (see FIG. 4).

Figure 3:
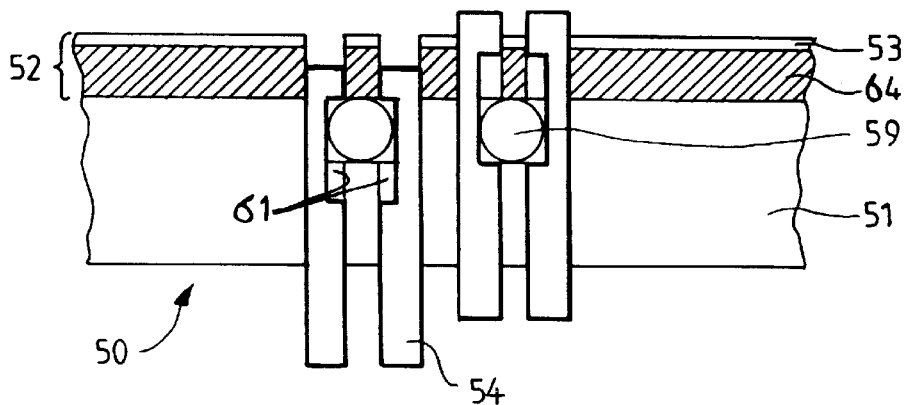
FIG. 3 is a cross-sectional schematic view of a portion of the inspection pin cassette on an enlarged scale over FIG. 2.

Enlarged FIG. 3 shows more detail of the arrangement of the cassette 50 and inspection pins 54, and also the manner in which the inspection pins are retained within the cassette. Two pairs of pins 54 are shown, the left hand pair in the normal rest position and the right hand pair in an overextended position. Each pin of a pair includes a cut-out (or channel) 61, the cut-outs of a pair facing one another as shown (to form a rectangular opening). Disposed between the opposing cut-outs is a retaining mechanism in the form of piano wire 59, running between the rows of pins, which is fixed in the cassette and acts to retain, and delimit the reciprocal movement of, the inspection pins 54 within cassette 50.

Returning to FIG. 2, located between the connector 30 and the lower face of the cassette 50 is a printed circuit board 70 which has a plurality of vias (openings) 72 defined therein. The apparatus provides guides for ensuring that the connector 30, printed circuit board 70 and cassette 50 are aligned such that when the connector is merged with the PCB, the connector pins 34, 36 pass through vias 72 in the PCB and are urged against the inspection pins 54 of the cassette.

The merging process can be considered to take place in two stages. The first partial merger stage (which has already occurred in FIG. 2) involves a first upward movement of the air cylinder 60 against the nest plate 20 which causes two connector retaining posts (one of which is shown at 37) to enter corresponding holes 74 in the PCB. At the same time, the connector pins 34 enter the corresponding vias 72 in the PCB. At this point there is no contact between the connector pins and the inspection pins, as seen in FIG. 2.

It will be noted that all the connector pins 34 shown in FIG. 2 are correctly located within their corresponding vias. As has been described hereinabove, perfect merging does not always occur in practice and one or more connector pins 34 may become deformed or bent during the partial merging process.

Figure 4:
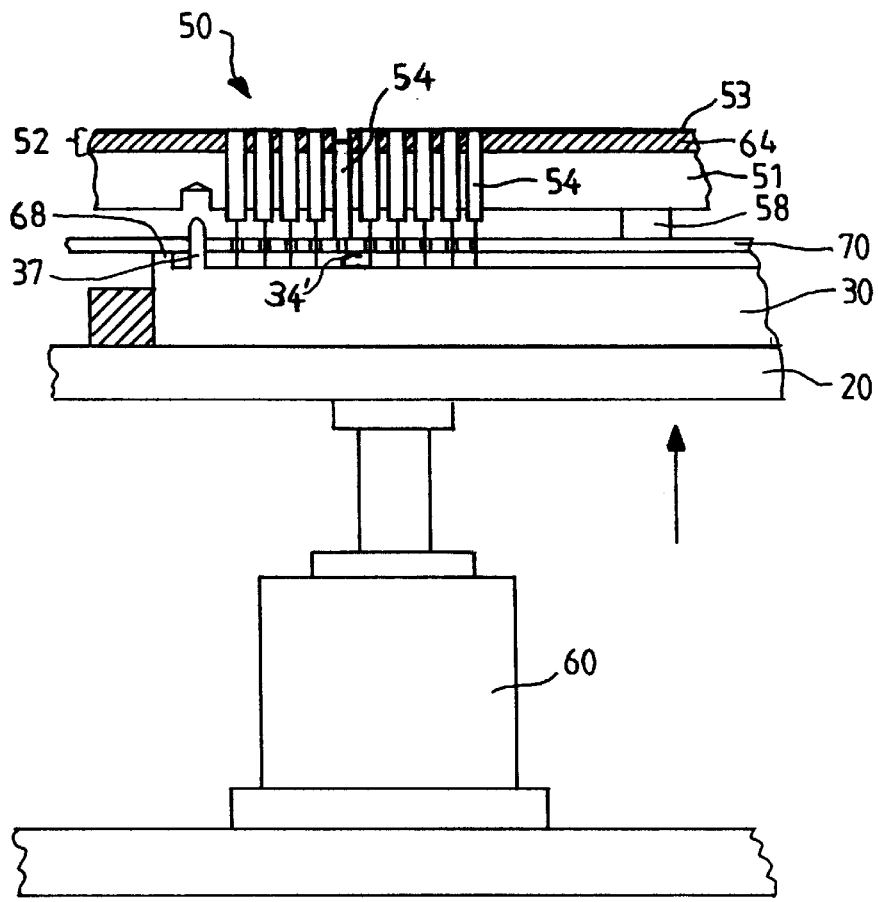
FIG. 4 is a cross-sectional schematic view of part of the apparatus of FIG. 1, in which the PCB and connectors are shown in a fully merged position.

The presence of any bent or deformed connector pins is detected as a result of the final merging step in which the connector 30 merges fully with PCB 70, and the mated connector and PCB are urged by air cylinder 60 against the inspection pins 54 of cassette 50. The end point of this second stage is shown in FIG. 4. In this position, stops 68 on the connector (one of which is shown in FIGS. 2 and 4) abut the lower surface of PCB 70. A PCB stop 58 depending from the lower surface of the cassette defines the upper limit of travel of the PCB.

Each of the connector pins 34 which have correctly merged with the PCB (all except one, the fifth pin from the left in FIG. 4, 34', which is shown bent) pass through its respective via 72 and presses against the corresponding inspection pin 54 to cause the inspection pin to move upwards in its channel to a final extended position where the top of the inspection pin 54 is flush with the top surface of the inspection plate 53. The top of each inspection pin is advantageously designed to have the same visual appearance of the surface of the inspection plate such that visual appearance of the plate and correctly merged inspection pin tops is essentially homogeneous. Thus, in the FIG. 4 example, all pin tops are flush except the inspection pin 54 not engaged by the bent connector pin.

As seen in FIG. 4, one of the connector pins (34') has been bent during the merger process such that it lies between connector 30 and the lower surface of the PCB. Thus, the corresponding inspection pin 54 remains in the rest position, countersunk with respect to the top surface of the inspection plate. In this position, the contrast layer is visible to the operator at the top surface of the inspection plate. This contrast layer provides a ready indication of the presence and location of the 'defective' inspection pin(s) against the otherwise homogeneous appearance of the correctly merged inspection pins and plate top surface.

Figure 5:
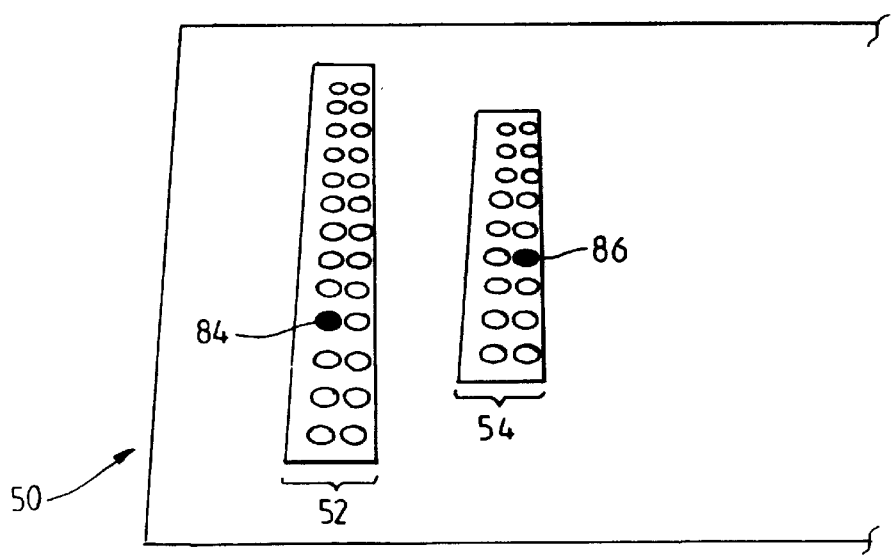
FIG. 5 is a top view of a portion of the inspection pin cassette.

With reference to FIG. 5, there is shown a schematic view of a portion of the upper surface of the inspection plate after a merge operation. Two sets of inspection pins are shown which correspond to two connectors. The presence and location of the missing connector pins are indicated by black circles 84, 86 which represent the operator's view of the contrast layer within the channel.

Using this technique, the operator is able to make a rapid assessment of the presence and location of improperly merged connector pins. Any defective connector is replaced and the merge process repeated.

As has been mentioned, both cassette 50 and nest plate fixtures 22 and 24 are removable from the apparatus. In this way, the apparatus can be readily adapted for use with different types of connectors having different sizes and numbers of pins.

Although the merge operation has been described as having two stages, it will be appreciated that the present invention is equally applicable to a single-stage merge process.

What is claimed is:

1. An apparatus for connecting an electrical component having a plurality of conductive pins to one side of a circuit board having a plurality of corresponding openings, said pins when correctly positioned in said openings extending through the circuit board, said apparatus comprising:

visual indication structure for providing a visual indication of the proper placement of said conductive pins within said corresponding openings within said circuit board, said visual indication structure comprising a plate having first and second faces and a black plastic contrast layer between said first and second faces and including a plurality of channels defined therein and further including a plurality of inspection pins mounted for reciprocal movement within said channels between a first position and a second, extended position, said inspection pins in said plate corresponding in number to said component conductive pins and having a cross sectional area greater than that of said conductive pins, selected ones of said inspection pins including a first end face such that said end faces of said inspection pins are capable of lying substantially flush with said first face of said plate;

locating structure for locating and aligning said circuit board and electrical component with respect to said plate of said visual indication structure such that said second face of said plate is located substantially adjacent an opposite side of said circuit board from said one side having said component thereon, said inspection pins in said plate of said visual indication structure aligning with corresponding ones of said conductive pins and said openings; and merging structure for merging said circuit board and said electrical component such that when said component and board are merged, those conductive pins which extend through said circuit board engage said corresponding ones of said inspection pins to cause said inspection pins to move from said first position to said second, extended position to thereby provide a visual indication of the proper placement of said connector pins in said openings and provide a visual indication of said black plastic contrast layer where said inspection pins do not move to said second position.

2. The apparatus of claim 1 wherein said plate is comprised of metallic material, said metallic material and said black plastic contrast layer forming a laminar structure.

3. The apparatus of claim 2 wherein said metallic material is aluminum.

* * * * *